United States Patent [19]

Stuckey

[11] 4,426,774
[45] Jan. 24, 1984

[54] PROCESS FOR PRODUCING A CIRCUIT MODULE

[75] Inventor: Ronald L. Stuckey, Monroe, Ind.

[73] Assignee: CTS Corporation, Elkhart, Ind.

[21] Appl. No.: 374,420

[22] Filed: May 3, 1982

Related U.S. Application Data

[62] Division of Ser. No. 153,843, Apr. 7, 1980, Pat. No. 4,345,300.

[51] Int. Cl.³ .............................................. H05K 3/30
[52] U.S. Cl. .................................... 29/841; 339/17 LC
[58] Field of Search ................ 29/832, 891, 588, 843; 339/17 C, 17 LC, 17 CF; 357/72

[56] References Cited

U.S. PATENT DOCUMENTS

| | | |
|---|---|---|
| 3,280,378 | 10/1966 | Brady et al. |
| 3,314,128 | 4/1967 | Schütze et al. ................. 29/893 |
| 3,346,774 | 10/1967 | Brady ................................ 361/400 |
| 3,377,514 | 4/1968 | Ruehlemann et al. ............ 317/101 |
| 3,388,301 | 6/1968 | James ............................... 317/234 |
| 3,423,638 | 1/1969 | Dix et al. ........................ 317/101 |
| 3,436,810 | 4/1969 | Kauffman . |
| 3,484,536 | 12/1969 | Jaeschke et al. ................. 357/72 X |
| 3,486,076 | 12/1969 | Abbott et al. .................... 317/101 |
| 3,495,322 | 2/1970 | Goldstein . |
| 3,496,283 | 2/1970 | Andrasfay ....................... 174/68.5 |
| 3,512,115 | 5/1970 | Solow ............................... 338/285 |
| 3,529,108 | 8/1970 | English ........................... 339/17 C X |
| 3,529,212 | 9/1970 | Ballard ............................. 361/401 |
| 3,531,581 | 9/1970 | Chesemore .................. 339/17 LC X |
| 3,548,076 | 12/1970 | Cooke et al. ...................... 174/52 |
| 3,597,839 | 8/1971 | Jaccodine ........................ 29/626 |
| 3,634,600 | 1/1972 | Griffin et al. .................... 174/52 S |
| 3,665,592 | 5/1972 | Apospors ......................... 29/588 |
| 3,685,002 | 8/1972 | Kennedy ........................ 339/17 CF |
| 3,693,252 | 9/1972 | Robertson et al. ................. 29/841 |
| 3,700,788 | 10/1972 | Spurck ............................ 174/52 S |
| 3,745,508 | 7/1973 | Bruder et al. .................... 338/320 |
| 3,791,025 | 2/1974 | Guarjado ......................... 29/577 |
| 3,806,766 | 4/1974 | Fanning ...................... 317/101 CC |
| 3,815,077 | 6/1974 | Anhalt et al. ................. 339/17 CF |
| 3,825,876 | 7/1974 | Damon et al. ................. 339/17 CF |
| 3,939,558 | 2/1976 | Riley . |
| 4,012,579 | 3/1977 | Fox et al. ........................ 174/52 PE |

Primary Examiner—Howard N. Goldberg
Assistant Examiner—Carl J. Arbes
Attorney, Agent, or Firm—Larry J. Palguta

[57] ABSTRACT

Circuit module (10) having a row of connector pins (21) and being approximately 4 mm. thick or less, and including an electrical circuit (22) connected to the connector pins (21). In prior art designs, it has not been possible to utilize a large substrate having good heat dissipation properties and, at the same time, include an attached electrical device, without exceeding the allowed maximum dimensions of the module. The present invention solves the problem by recessing an edge (17) of the substrate (11), depositing spaced-apart conductor films (26a and 26b) in the recess (16) that electrically connect with the electrical circuit (22), and soldering (31a and and 31b) the electrical device (30) to the conductor films (26a and 26b). Principal uses for the invention include digital computers and similar complex electronic devices.

10 Claims, 7 Drawing Figures

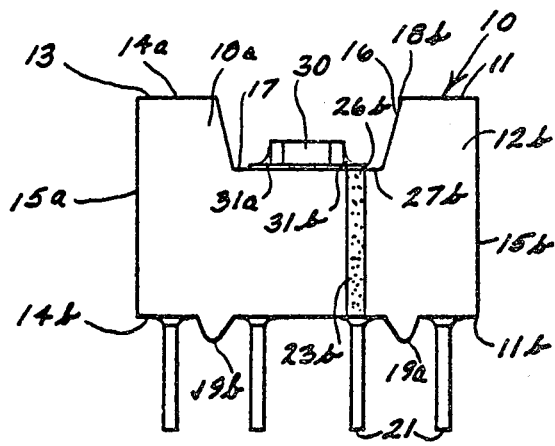

PROCESS FOR PRODUCING A CIRCUIT MODULE

DESCRIPTION

This is a division of application Ser. No. 153,843, filed Apr. 7, 1980, now U.S. Pat. No. 4,345,300 issued Aug. 7, 1982 in accordance with PCT application Ser. No. 79-01142 filed Dec. 18, 1979.

TECHNICAL FIELD

The present invention pertains to a circuit module and, more particularly, to a circuit module having conductor films deposited onto a surface of a substrate and having a row of terminals extending from an edge of the substrate.

BACKGROUND ART

Circuit modules, whether of the single in-line package (SIP) or the dual in-line package (DIP), have typically been of two basic types of construction.

One of the basic types of construction has utilized a thin ceramic substrate upon which an electronic circuit is deposited or attached; and then the substrate with the electronic circuit is encapsulated in a housing. The electronic circuit generally contains thick film and or chip devices, such as resistors and capacitors connected with thick film conductors. A common method of forming the housing has been to mold a thermoset plastic over the substrate. Another method of encapsulating has included using two cover portions and then injecting a potting compound between the cover portions as taught by Fox et al. in U.S. Pat. No. 4,012,579. In a similar method, a single cover has been adhesively secured over the substrate and the electrical circuit by use of an adhesive tape as taught by Riley in U.S. Pat. No. 3,939,558.

However, with the advent and increasing use of smaller circuit modules, slightly less than 4 mm. thick or which can be only 2 mm. thick, encapsulated designs have had two serious disadvantages. One of these disadvantages has been relatively weak and insecure attachment of the connector pins both to the housing and to the electrical circuit, thus severely limiting the reliability of the circuit module. The other serious disadvantage has been poor heat dissipation properties and a resultant poor power rating for the molded and potted constructions.

Both the problem of the weak mechanical and electrical attachment of the connector pins and the problem of poor heat dissipation have been solved by constructions taught by Brady et al. in U.S. Pat. No. 3,280,378, and by Brady in U.S. Pat. No. 3,346,774, both of common assignee. In these designs, a thick ceramic substrate having dimensions almost the same as the housing is used, the connector pins are securely attached to the substrate by force fitting the pins into holes or recesses provided in the substrate, the connector pins are electrically connected to the electrical circuit by soldering, and the electrical circuit is preferably insulated with a nonconductive coating. The resulting module is both mechanically and electrically superior. In addition, the heat dissipation properties of the module are superior and the power rating can be higher because a ceramic substrate has heat conductivity properties that are approximately sixty times as great as a thermosetting plastic used for encapsulating a thin substrate. Also the heat dissipation properties are superior even when the electrical circuit on the thick ceramic substrate is covered by a thin layer of nonconductive material because more than 90% of the volume of the housing defining the module used in the design is ceramic which has excellent heat conductivity.

Circuit modules of the type described above, using a thick ceramic substrate, using a circuit that includes thick film conductors and resistors, and using a thin nonconductive coating, have had one limitation. This limitation has been the inability to attach a separate electrical device, such as a chip capacitor, to the circuit without an excessive increase in the thickness of the circuit module. This disavantage becomes more severe when the circuit requires the attachment of a capacitor that is almost 1 mm. thick.

The present invention eliminates this one disadvantage of the construction which is taught in U.S. Pat. Nos. 3,280,378 and 3,346,774, while retaining all of the advantages thereof.

DISCLOSURE OF THE INVENTION

In accordance with the broader aspects of this invention, there is provided a circuit module comprising a dielectric ceramic substrate having first and second spaced-apart side surfaces, having a plurality of edge surfaces that interconnect the side surfaces, and having a plurality of pin-receiving recesses that intercept one of the side surfaces. A plurality of connector pins are force fitted into the pin-receiving recesses and project outwardly from the substrate in substantially planar relationship to the side surfaces. An electrical circuit is disposed on one of the side surfaces by screening or painting conductor and resistor films or patterns onto the side surface. The electrical circuit is connected to selected ones of the connector pins by soldering.

The substrate includes a component-receiving recess in one of the edge surfaces and the component-receiving recess includes a recessed surface. First and second spaced-apart conductor films are deposited onto the recessed surface and are electrically connected to selected ones of the connector pins. A separate electrical device, such as a chip capacitor, is then mechanically and electrically connected to the spaced-apart conductor films by a body of conductive material such as solder.

The advantages of the present invention include compactness, good heat dissipation properties, good mechanical strength between the connector pins and the substrate, good electrical connection between the connector pins and the electrical circuit, the ability to add a separate or discrete electrical device to the circuit without increasing the overall dimensions, e.g., thickness of the module, the ability to utilize dip soldering for connecting the connector pins to the circuit module, secure mechanical attachment of the separate electrical device to the circuit module such as by soldering of the separate electrical device to the spaced-apart conductor films, and good electrical connection of the separate electrical device to the electrical circuit of the circuit module by the aforementioned solder connection.

Further advantages of the present invention will become apparent as the following description proceeds, and the features of novelty characterizing the invention will be pointed out with particularity in the claims annexed to and forming a part of this specification.

For a better understanding of the present invention, reference may be had to the accompanying drawings

BRIEF DESCRIPTION OF THE DRAWINGS

FIG. 1 is a perspective view of the circuit module with a nonconductive coating and showing the connector pins thereof extending toward the viewer;

FIG. 2 is a schematic drawing of the electrical circuit of the circuit module of FIG. 1;

FIG. 3 is a slightly enlarged rear view of the module of FIG. 1 with the nonconductive coating and showing a discrete electrical device supported in a notch;

FIG. 4 is a side view of the circuit module of FIG. 3;

FIG. 5 is a front view of the circuit module of FIGS. 3 and 4 showing the discrete electrical device supported in the notch and film resistors supported on a surface of the module, both the device and the resistors being connected to the connector pins;

FIG. 6 is an enlarged fragmentary view of the circuit module of FIG. 5; and

FIG. 7 is a front view of an additional embodiment of a circuit module.

BEST MODE FOR CARRYING OUT THE INVENTION

Referring now to the drawings, and more particularly to FIGS. 1 and 3–5, a circuit module 10 includes a ceramic substrate 11 of dielectric material, e.g., alumina or steatite, having spaced-apart side surfaces 12a, 12b having edge surface means 13 that includes spaced-apart edge surfaces 14a, 14b and that includes spaced-apart edge surfaces 15a, 15b. The substrate 11 includes a component-receiving recess 16 interrupting the edge surface 14a that includes an additional edge surface means 13 defined by a recessed surface 17 and defines a pair of ears 18a, 18b extending outwardly from the recessed surface 17. The substrate 11 also includes a pair of stand-offs 19a, 19b extending outwardly from the edge surface 14b.

Specifically referring to the substrate 11, it includes a plurality of pin-receiving recesses 20 preferably square in cross-section. A plurality of connector pins 21 are force fitted into respective ones of the pin-receiving recesses 20, the connector pins 21 preferably being of cylindrical shape; and the force fitting of the connector pins 21 into the pin-receiving recesses 20 preferably comprises interference between the cylindrical shape of the connector pins 21 and the square cross-sectional shape of the pin-receiving recesses 20.

As shown in FIG. 5, an electrical circuit 22 is deposited onto the side surface 12 of the substrate 11. The electrical circuit 22 includes deposited conductor films 23a, 23c, and 23d; and the electrical circuit 22 further includes deposited resistor films 24a and 24b respectively overlapping and electrically connecting the deposited conductor films 23a and the deposited conductor films 23c, 23d. The circuit module 10 further includes deposited conductor pads 25a, 25b, 25c, and 25d deposited upon the edge surface 14b. The deposited conductor pads 25a, 25c, and 25d are electrically connected to the deposited conductor films 23a, 23c, and 23d respectively by overlapping of the respective conductor films at a corner 11a of the substrate 11. In like manner, a deposited conductor film 23b on the side surface 12b is electrically connected to the deposited conductor pad 25b by overlapping the deposited conductor pad 25b at a corner 11b of the substrate 11.

The connector pins 21 are both mechanically and electrically connected to respective ones of the conductor pads 25a, 25b, 25c, and 25d by dipping the connector pins 21 and the edge surface 14b in a molten solder. Referring now to FIG. 4, a side view of the circuit module 10 is shown having the thickness of both the conductor films 23a, 23b, 23c, and 23d and the resistor films 24a and 24b slightly enlarged to illustrate that the conductor and resistor films are deposited on the substrate 11.

Referring now to FIGS. 3, 5 and 6, the circuit module 10 further includes a pair of spaced-apart metallic conductors or spaced-apart conductor films 26a, 26b which are preferably formed by depositing the films onto the recessed surface 17. The conductor film 26a is electrically connected to the conductor film 23a (see FIGS. 5 and 6) by overlapping the films 26a, 23a at a corner 27a of the substrate 11. In like manner, the conductor film 26b is electrically connected to the conductor film 23b by overlapping the films 26b, 23b at a corner 27b.

An electrical device 30, which may be either an integrated circuit chip that includes a plurality of active and/or inactive components or which may be a single function component that is either active or passive, is attached to the conductor films 26a, 26b by a body of conductive material such as solder or solder connections 31a, 31b as best shown in FIG. 6. In a preferred configuration, the electrical device 30 comprises a capacitor but, in other embodiments, the electrical device 30 may comprise an active component such as a diode or transistor or a passive component such as a resistor having conductive metallic ends 32a, 32b. The solder connections 31a, 31b may be effected by heating preforms or by separately soldering these two connections.

Referring now to FIGS. 3, 5 and 6, the circuitry thus far described is schematically shown in FIG. 2. As can be seen in FIG. 2, by a crossover of connectors at a location 22a, it is advantageous to deposit the conductor film 23b on the side surface 12b as shown. Thus, the embodiment illustrated utilizes both of the side surfaces, 12a, 12b. However, in many embodiments conductor films are only deposited on one of the side surfaces, 12a or 12b.

In an additional embodiment, a circuit module 110 (see FIG. 7) includes like-numbered and like-named parts as have been previously described, except that the recesses 116a, 116b having recessed surfaces 117 are located at opposite end surfaces 115a, 115b. The conductor films 126a, 126b have been applied to each of the recessed surfaces 117 and electrical devices 130 are soldered to the films 126a, 126b.

Referring now to FIG. 1, a nonconductive material 40 such as epoxy has been used to fill the component-receiving recess 16 thereby providing insulation for the conductor films 26a, 26b and the electrical device 30 and also concealing the device 30. A layer of nonconductive material or coating 41 has been applied to the surfaces 12a, 12b of the substrate 11, thereby covering both of the side surfaces 12a, 12b and the electrical circuit 22. It should be noticed that the edge surfaces 14a, 14b, 15a, 15b in the preferred embodiment as shown in FIG. 1 are not covered, thereby leaving these surfaces on the substrate 11 exposed for maximum heat dissipation and for a maximum power rating for the circuit module 10.

The preferred method includes depositing the conductor films 23a, 23b, 23c, 23d, depositing the conductor pads 25a, 25b, 25c, 25d, and depositing the conductor films 26a, 26b on the surfaces of the substrate 11 and firing the substrate with the films and pads. The resistor films 24a, 24b are then deposited on the substrate, and the substrate with resistor films 24a, 24b is fired. The connector pins 21 are then forced into the pin-receiving recesses 20, the connector pins 21 are soldered to respective ones of the conductor pads 25a, 25b, 25c, 25d, and then the metallic ends 32a, 32b are connected to respective ones of the conductor films 26a, 26b. The recess 16 is then filled with the nonconductive material 40. The surfaces 12a, 12b are then covered with the layer of nonconductive material 41 which preferably has a thickness of 0.025 to 0.05 mm. and preferably comprises an epoxy.

In summary, the surfaces 14a, 14b, 15a, 15b and 17 provide the edge surface means 13 for interconnecting the side surfaces 12a, 12b. By disposing the electrical device 30 on the recessed surface 17 and within the planar bounds of the side surfaces 12a, 12b, minimum thickness for the completed circuit module 10 is maintained.

The dielectric substrate 11 may be 96% to 98% of the total thickness of the circuit module 10 because of the small thickness of both the electrical circuit 22 and the coating 41. Thus the circuit module 10 has excellent heat dissipation and power capacity ratings for a given size. In addition, the circuit module 10 of the present invention provides added circuit flexibility by being able to accept additional electrical devices, such as the electrical device 30, without increasing the overall thickness of the circuit module 10 and without appreciably reducing the heat dissipation capacity and power rating thereof.

While there have been illustrated and described what are at present considered to be preferred embodiments of the present invention, it will be appreciated that numerous changes and modifications are likely to occur to those skilled in the art, and it is intended in the appended claims to cover all those changes and modifications which fall within the true spirit and scope of the present invention.

INDUSTRIAL APPLICABILITY

The present invention is industrially applicable to complex electrical circuits, such as digital computers, where a plurality of microminiature circuit modules are to be installed in a limited space.

I claim:

1. A process for producing a circuit module supporting a discrete electrical device without contributing to the width of the circuit module, comprising the steps of: forming a ceramic substrate having a recess in an end surface thereof, disposing conductive means on a surface of the recess and electrical circuit means including metallized conductive paths on a side of the substrate whereby the conductive means is electrically connected to the circuit means, securing terminal means to said substrate and in electrical connection with selected conductive paths, disposing a discrete electrical device of preselected electrical function within said recess with the discrete electrical device proportioned to be disposed wholly within said recess, connecting by electrical and mechanical means the discrete electrical device to the conductive means, and filling the entirety of the unoccupied portion of said recess with an electrically inert material to produce substantially planar side surfaces and end surface means to encapsulate and electrically protect the electrical device confined within said material whereby the stack-up tolerances of a plurality of such modules disposed in side-by-side contiguous relationship corresponds substantially to the cummulative widths of the substrates.

2. The process in accordance with claim 1, wherein the electrical and mechanical means connecting the electrical device to the conductive means comprises a body of metal.

3. The process in accordance with claim 1, further comprising the step of forming another recess in another end surface and disposing another discrete electrical device therein.

4. The process in accordance with claim 1, including the step of forming a substrate having only minimal sized terminal receiving openings and recess in order to preserve the essential heat dissipating properties of the ceramic substrate.

5. The process in accordance with claim 1, further comprising step of disposing another electrical circuit on another side of said substrate and operatively connected to said terminal means.

6. The process in accordance with claim 1, wherein the metallized conductive paths formed along a side of each module do not contribute substantially to stack-up dimensions whereby the cumulative dimension of the total stack is substantially equal to the combined widths of said substrates.

7. The process in accordance with claim 1, wherein the terminal means secured to said substrate comprises a plurality of connector pins selectively interconnected through said metallized conductive paths with the active electrical device.

8. The process in accordance with claim 1, including the step of force fitting the terminal means into openings at an end surface of said substrate.

9. The process in accordance with claim 1, including the step of forming complementary openings along an end surface of said substrate and force-fitting non-conforming cross-sectional shaped connector pins into such complementary openings for permanent disposal therein.

10. The process in accordance with claim 1, further comprising the step of disposing a thin coating of nonconductive material on a side of the substrate.

* * * * *